(12) United States Patent
Kohda

(10) Patent No.: US 7,876,798 B2  
(45) Date of Patent: Jan. 25, 2011

(54) NITRIDE SEMICONDUCTOR LASER DEVICE

(75) Inventor: Shinichi Kohda, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 12/344,343

(22) Filed: Dec. 26, 2008

(65) Prior Publication Data

US 2009/0175305 A1    Jul. 9, 2009

(30) Foreign Application Priority Data

Dec. 28, 2007    (JP)    ............................. 2007-340213

(51) Int. Cl.
*H01S 5/00*    (2006.01)

(52) U.S. Cl. ................. 372/43.01; 372/46.012

(58) Field of Classification Search ............. 372/44.01, 372/46.01, 45.01; 438/33

See application file for complete search history.

(56) References Cited

U.S. PATENT DOCUMENTS 6,266,355 B1 * 7/2001 Sverdlov ................. 372/45.01

7,397,834 B2 * 7/2008 Kozaki et al. .......... 372/46.012

FOREIGN PATENT DOCUMENTS

JP    05-343742    12/1993
JP    06-283758    10/1994

* cited by examiner

*Primary Examiner*—Minsun Harvey
*Assistant Examiner*—Tuan N. Nguyen
(74) *Attorney, Agent, or Firm*—Rabin & Berdo, PC

(57) ABSTRACT

A nitride semiconductor laser device is formed by growing a group III nitride semiconductor multilayer structure on a substrate containing no Al. The group III nitride semiconductor multilayer structure forms a structure including an n-type semiconductor layer, a p-type semiconductor layer, and a light emitting layer held between the n-type semiconductor layer and the p-type semiconductor layer. The n-type semiconductor layer includes an n-type cladding layer containing Al and an n-type guide layer having a smaller band gap than the n-type cladding layer. The p-type semiconductor layer includes a p-type cladding layer containing Al and a p-type guide layer having a smaller band gap than the p-type cladding layer. A removal region is formed by partially removing the layers containing Al in the group III nitride semiconductor multilayer structure from the substrate.

11 Claims, 6 Drawing Sheets

NITRIDE SEMICONDUCTOR LASER DEVICE

BACKGROUND OF THE INVENTION

1. Field of the Invention

The present invention relates to a nitride semiconductor laser device including a semiconductor multilayer structure made of group III nitride semiconductors.

2. Description of Related Art

Group III-V semiconductors employing nitrogen as a group V element are called "group III nitride semiconductors", and typical examples thereof include aluminum nitride (AlN), gallium nitride (GaN) and indium nitride (InN), which can be generally expressed as $Al_X In_Y Ga_{1-X-Y} N$ ($0 \leq X \leq 1$, $0 \leq Y \leq 1$ and $0 \leq X+Y \leq 1$).

Short wavelength laser sources such as blue and green laser sources are increasingly employed in the fields of high-density recording in optical disks represented by a DVD, image processing, medical instruments, measuring instruments and the like. Such a short wavelength laser source is constituted of a laser diode employing GaN semiconductors, for example.

A GaN semiconductor laser diode is manufactured by growing group III nitride semiconductors on a gallium nitride (GaN) substrate by metal-organic vapor phase epitaxy (MOVPE). More specifically, an n-type cladding layer, an n-type guide layer, a light emitting layer (active layer), a p-type guide layer, a p-type electron blocking layer, a p-type cladding layer and a p-type contact layer are grown on the GaN substrate by the metal-organic vapor phase epitaxy, to form a semiconductor multilayer structure consisting of these semiconductor layers. For example, the n-type cladding layer is formed by a single AlGaN film, or has an AlGaN/GaN superlattice structure. The n-type guide layer is made of InGaN or GaN. The light emitting layer has a multiple quantum well structure including quantum well layers made of InGaN. The p-type guide layer is constituted of InGaN or GaN. The p-type electron blocking layer is constituted of AlGaN. The p-type cladding layer is formed by a single AlGaN film, or has an AlGaN/GaN superlattice structure. The p-type contact layer is constituted of AlInGaN.

According to this structure, the light emitting layer emits light by recombination of electrons and positive holes injected from the n-type layer and p-type layer respectively. This light is confined between the n-type cladding layer and the p-type cladding layer, and is propagated in a direction orthogonal to a stacking direction of the semiconductor multilayer structure. Cavity end faces are formed on both ends in the propagation direction, so that the light is resonantly amplified while repeating induced emission between the pair of cavity end faces and partially emitted from the cavity end faces as laser beams.

SUMMARY OF THE INVENTION

The lattice constants of group III nitride semiconductors vary with the compositions thereof. In other words, the lattice constants of InGaN, GaN and AlGaN, for example, are different from one another. When layers of these group III nitride semiconductors are stacked, therefore, stress is caused and a nitride semiconductor laser device is warped due to this stress. This warp remarkably appears as the thickness of the device is reduced. When the warp is remarkable, the device is easily cracked, and hence the yield is deteriorated accordingly.

In particular, the lattice constant of AlGaN is smaller than those of group III nitride semiconductors having other compositions, and an AlGaN crystal is hard. Therefore, AlGaN applies remarkable stress to layers grown in lattice matching with the AlGaN crystal, to warp a substrate. When a device includes a layer containing AlGaN, therefore, the aforementioned problem more obviously arises. This problem is not limited to the AlGaN crystal, but a general group III nitride semiconductor crystal containing Al has a similar problem.

It is important to reduce the device size so that a large number of devices can be manufactured from a wafer, i.e., the yield of devices obtainable from the wafer is increased, in order to reduce the cost. When a semiconductor laser device is manufactured, on the other hand, cleavage planes employed as cavity mirrors must be formed in a stepless and smooth manner. According to an empirical fact, the device length (the cavity length or the width of the laser device) orthogonal to the cleavage planes must be sufficiently large with respect to the thickness of a substrate, in order to obtain smooth cleavage planes. In order to obtain smooth cleavage planes when manufacturing a small-sized semiconductor laser device, therefore, the thickness of a substrate must be reduced in accordance with the device size. In this case, the aforementioned problem of a warp arises.

Accordingly, an object of the present invention is to provide a nitride semiconductor laser device enabling reduction in thickness of a substrate by suppressing a warp resulting from stress, thereby allowing formation of excellent cavity end faces.

The foregoing and other objects, features and effects of the present invention will become more apparent from the following detailed description of the embodiments with reference to the attached drawings.

DETAILED DESCRIPTION OF PREFERRED EMBODIMENTS

Figure 1:
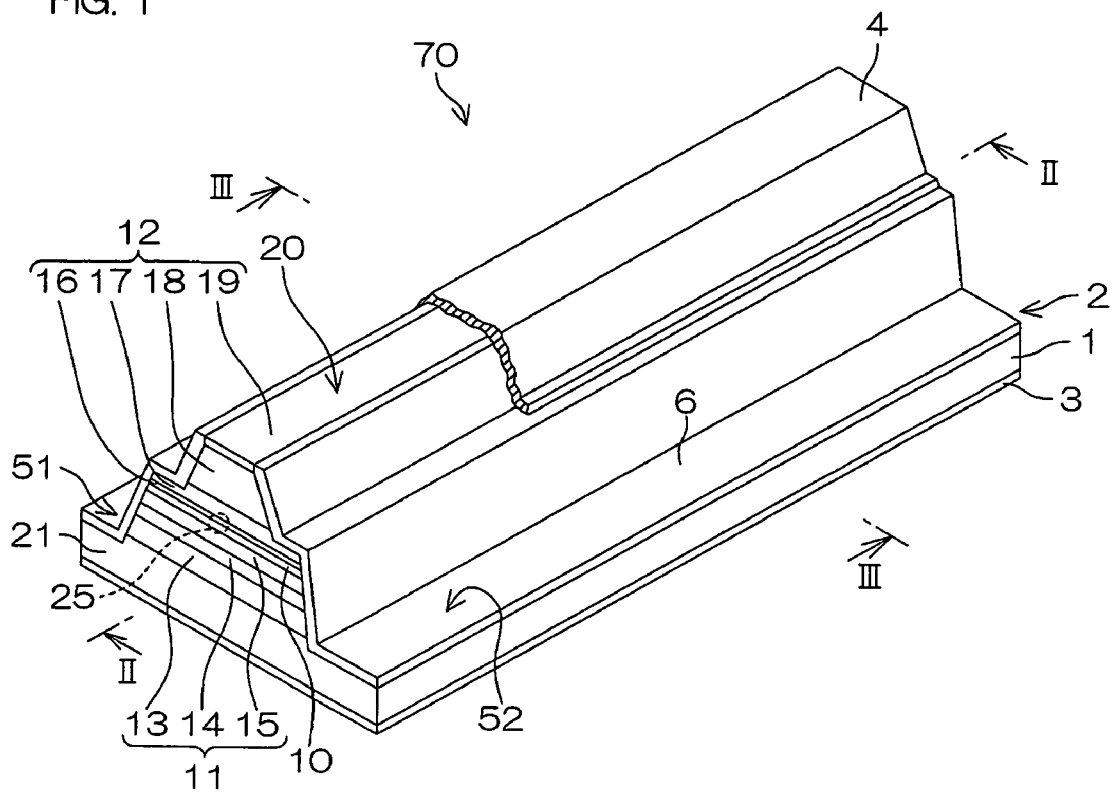
FIG. 1 is a perspective view for illustrating the structure of a semiconductor laser diode as a nitride semiconductor laser device according to an embodiment of the present invention.

A nitride semiconductor laser device according to one embodiment of the present invention is a nitride semiconductor laser device formed by growing a group III nitride semiconductor multilayer structure on a substrate containing no Al. The group III nitride semiconductor multilayer structure forms a structure including an n-type semiconductor layer, a p-type semiconductor layer, and a light emitting layer held between the n-type semiconductor layer and the p-type semiconductor layer. The n-type semiconductor layer includes an n-type cladding layer containing Al and an n-type guide layer having a smaller band gap than the n-type cladding layer. The p-type semiconductor layer includes a p-type cladding layer containing Al and a p-type guide layer having a smaller band gap than the p-type cladding layer. Further, a removal region is formed by partially removing the layers containing Al in the group III nitride semiconductor multilayer structure from the substrate.

According to this structure, the n-type cladding layer and the p-type cladding layer contain Al, and hence stress from these layers acts on the group III nitride semiconductor multilayer structure. In order to relax this stress, the removal region formed by partially removing the layers containing Al in the group III nitride semiconductor multilayer structure is provided on the substrate. Thus, the stress resulting from the layers containing Al can be relaxed, whereby a warp of the nitride semiconductor laser device can be suppressed, and the yield can be improved.

The warp can be so suppressed that the thickness of the device can be reduced, whereby an excellent cavity mirror can be formed by cleavage as a result. Thus, a nitride semiconductor laser device having excellent oscillation efficiency can be implemented. Further, the thickness of the device can be so reduced as to reduce the device size, whereby the yield of devices obtainable from a wafer (original substrate) can be increased. Thus, the cost can be reduced.

More specifically, the thickness of the device can be reduced to not more than 80 μm. Thus, the yield of the devices obtainable from the wafer can be increased, while an excellent cavity mirror can be formed by a cleavage plane.

For example, the cavity length of the nitride semiconductor laser device can be reduced to not more than 300 μm. Further, the width of the nitride semiconductor laser device can be reduced to not more than 150 μm. When the device size is reduced in this manner, the thickness of the device is so set to not more than 80 μm that a smooth cavity end face (cavity mirror) can be formed by cleavage when dividing the wafer into each device.

The removal region may be a region continuous from one cavity end face to another cavity end face. Preferably, the removal region is arranged to avoid a cavity region. More specifically, the removal region may be provided on a side edge or each side edge in a width direction orthogonal to a cavity direction.

The embodiment of the present invention is now described in more detail with reference to the attached drawings.

Figure 2:
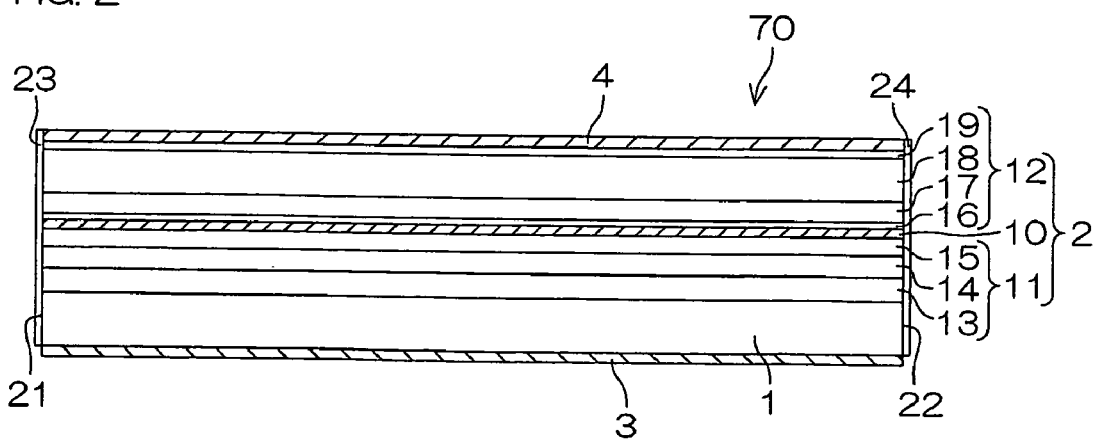
FIG. 2 is a longitudinal sectional view taken along the line II-II in FIG. 1.
Figure 3:
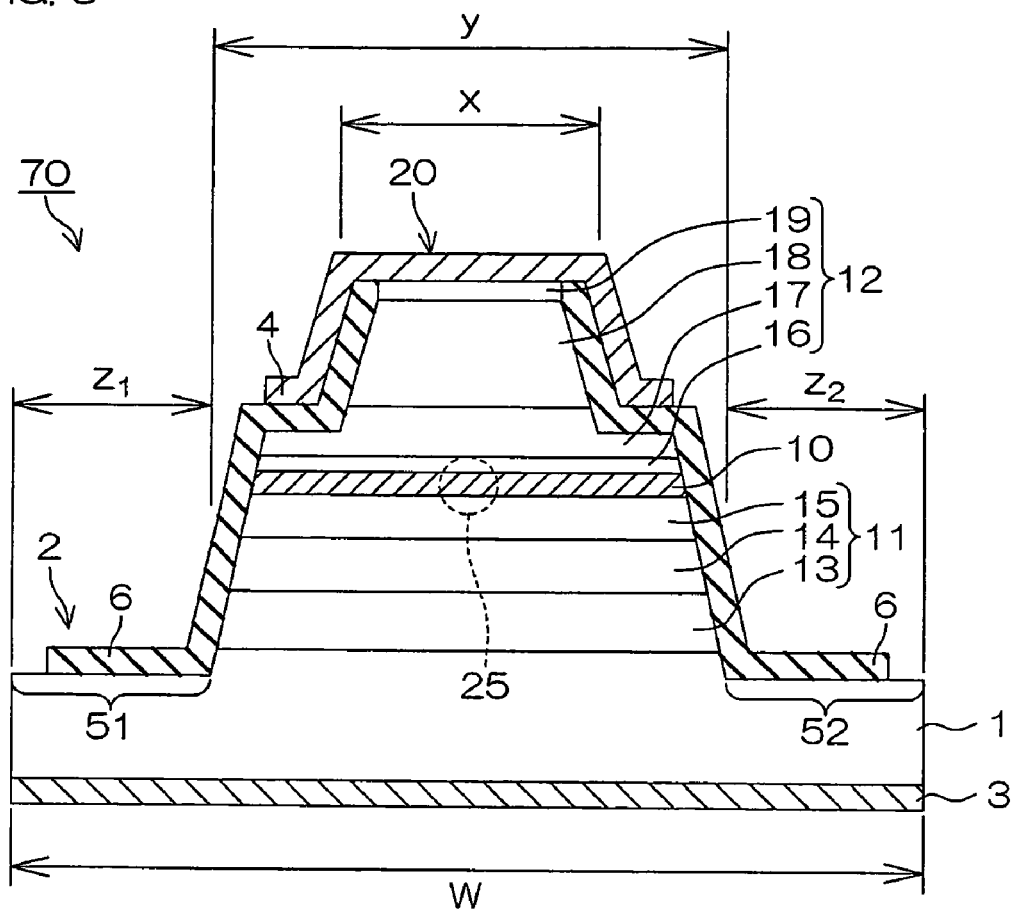
FIG. 3 is a cross sectional view taken along the line III-III in FIG. 1.

FIG. 1 is a perspective view for illustrating the structure of a nitride semiconductor laser diode 70 as a nitride semiconductor laser device according to an embodiment of the present invention. FIG. 2 is a longitudinal sectional view taken along the line II-II in FIG. 1, and FIG. 3 is a cross sectional view taken along the line III-III in FIG. 1.

This semiconductor laser diode 70 is a Fabry-Perot laser diode including a group III nitride semiconductor substrate 1, a group III nitride semiconductor multilayer structure 2 (group III nitride semiconductor layers) formed on the group III nitride semiconductor substrate 1 by crystal growth, an n-type electrode 3 formed to be in contact with the back surface (opposite to the group III nitride semiconductor multilayer structure 2) of the group III nitride semiconductor substrate 1, and a p-type electrode 4 formed to be in contact with the surface of the group III nitride semiconductor multilayer structure 2.

According to this embodiment, the group III nitride semiconductor substrate 1 is formed by a GaN monocrystalline substrate. The group III nitride semiconductor substrate 1 has a major surface defined by a c-plane or an m-plane, for example. The group III nitride semiconductor multilayer structure 2 is formed by crystal growth on this major surface.

Therefore, the group III nitride semiconductor multilayer structure 2 is made of group III nitride semiconductors having major growth surfaces defined by the same crystal plane as the group III nitride semiconductor substrate 1. When group III nitride semiconductors are epitaxially grown on a GaN monocrystalline substrate, excellent group III nitride semiconductor crystals hardly having dislocations can be grown.

The group III nitride semiconductor multilayer structure 2 includes a light emitting layer 10, an n-type semiconductor layered portion 11 and a p-type semiconductor layered portion 12. The n-type semiconductor layered portion 11 is disposed on a side of the light emitting layer 10 closer to the group III nitride semiconductor substrate 1, while the p-type semiconductor layered portion 12 is disposed on a side of the light emitting layer 10 closer to the p-type electrode 4. Thus, the light emitting layer 10 is held between the n-type semiconductor layered portion 11 and the p-type semiconductor layered portion 12, whereby a double heterojunction structure is provided. Electrons and positive holes are injected into the light emitting layer 10 from the n-type semiconductor layered portion 11 and p-type semiconductor layered portion 12 respectively. The electrons and the positive holes are recombined in the light emitting layer 10, to emit light.

The n-type semiconductor layered portion 11 is formed by successively stacking an n-type AlInGaN contact layer 13 (having a thickness of about 2 μm, for example), an n-type AlGaN cladding layer 14 (having a thickness of not more than 1.5 μm such as a thickness of 1.0 μm, for example), and an n-type GaN guide layer 15 (having a thickness of 0.1 μm, for example) from the side closer to the group III nitride semiconductor substrate 1. On the other hand, the p-type semiconductor layered portion 12 is formed by successively stacking a p-type AlGaN electron blocking layer 16 (having a thickness of 20 nm, for example), a p-type GaN guide layer 17 (having a thickness of 0.1 μm, for example), a p-type AlGaN cladding layer 18 (having a thickness of not more than 1.5 μm such as a thickness of 0.4 μm, for example), and a p-type AlInGaN contact layer 19 (having a thickness of 0.3 μm, for example) on the light emitting layer 10.

The n-type AlInGaN contact layer 13 is a low-resistance layer. The p-type AlInGaN contact layer 19 is a low-resistance layer for attaining ohmic contact with the p-type electrode 4. The n-type AlInGaN contact layer 13 is made of an n-type semiconductor prepared by doping AlInGaN with Si, for example, serving as an n-type dopant in a high doping concentration ($3 \times 10^{18}$ cm$^{-3}$, for example). The p-type AlInGaN contact layer 19 is made of a p-type semiconductor prepared by doping AlInGaN with Mg serving as a p-type dopant in a high doping concentration ($3 \times 10^{19}$ cm$^{-3}$, for example).

The n-type AlGaN cladding layer 14 and the p-type AlGaN cladding layer 18 provide a light confining effect confining the light emitted by the light emitting layer 10 therebetween. The n-type AlGaN cladding layer 14 is made of an n-type semiconductor prepared by doping AlGaN with Si, for example, serving as an n-type dopant (in a doping concentration of $1 \times 10^{18}$ cm$^{-3}$, for example). The p-type AlGaN cladding layer 18 is made of a p-type semiconductor prepared by doping AlGaN with Mg serving as a p-type dopant (in a doping concentration of $1 \times 10^{19}$ cm$^{-3}$, for example).

The n-type GaN guide layer 15 and the p-type GaN guide layer 17 are semiconductor layers providing a carrier confining effect for confining carriers (electrons and positive holes) in the light emitting layer 10, having smaller band gaps than the n-type AlGaN cladding layer 14 and the p-type AlGaN cladding layer 18 respectively. These guide layers 15 and 17 improve the efficiency of recombination of the electrons and the positive holes in the light emitting layer 10. The n-type GaN guide layer 15 is made of an n-type semiconductor prepared by doping GaN with Si, for example, serving as an n-type dopant (in a doping concentration of $1 \times 10^{18}$ cm$^{-3}$, for example), while the p-type GaN guide layer 17 is made of a p-type semiconductor prepared by doping GaN with Mg, for example, serving as a p-type dopant (in a doping concentration of $5 \times 10^{18}$ cm$^{-3}$, for example).

The p-type AlGaN electron blocking layer 16, made of a p-type semiconductor prepared by doping AlGaN with Mg, for example, serving as a p-type dopant (in a doping concentration of $5 \times 10^{18}$ cm$^{-3}$, for example), improves the efficiency of recombination of the electrons and the positive holes by preventing the electrons from flowing out of the light emitting layer 10.

The light emitting layer 10, having an MQW (multiple-quantum well) structure containing InGaN, for example, is a layer for emitting light by recombination of the electrons and the positive holes and amplifying the emitted light. More specifically, the light emitting layer 10 is formed by alternately repetitively stacking InGaN layers (each having a thickness of 3 nm, for example) and GaN layers (each having a thickness of 9 nm, for example) by a plurality of cycles. In this case, the In composition ratio in the InGaN layers is set to not less than 5%, so that the InGaN layers have relatively small band gaps and constitute quantum well layers. On the other hand, the GaN layers function as barrier layers having relatively large band gaps. The InGaN layers and the GaN layers are alternately repetitively stacked by two to seven cycles, for example, to constitute the light emitting layer 10 having the MQW structure. The emission wavelength is set to 400 nm to 550 nm, for example, by adjusting the In composition in the quantum well layers (InGaN layers). The barrier layers may be formed by InGaN layers having a smaller In composition than the quantum well layers, in place of the GaN layers.

The p-type semiconductor layer 12 is partially removed, to form a ridge stripe 20. More specifically, the p-type contact layer 19, the p-type AlGaN cladding layer 18 and the p-type GaN guide layer 17 are partially removed by etching, to form the ridge stripe 20 having a generally trapezoidal shape in cross sectional view. This ridge stripe 20 is formed along the m-axis direction when the major surface of the substrate 1 is defined by the c-plane, and formed along the c-axis direction when the major surface of the substrate 1 is defined by the m-plane.

The group III nitride semiconductor multilayer structure 2 has a pair of end faces 21 and 22 formed by cleaving both ends of the ridge stripe 20 in the longitudinal direction. The pair of end faces 21 and 22 are cleavage planes parallel to each other. Thus, the n-type GaN guide layer 15, the light emitting layer 10 and the p-type GaN guide layer 17 form a Fabry-Perot cavity with the end faces 21 and 22 serving as the cavity end faces (cavity mirrors), and the portion of the ridge stripe 20 forms a cavity region. The light emitted in the light emitting layer 10 reciprocates between the cavity end faces 21 and 22, and is amplified by induced emission. The amplified light is partially extracted from the cavity end faces 21 and 22 as laser beams.

In the semiconductor laser diode 70 according to this embodiment, removal regions 51 and 52 formed by partially removing the layers containing Al in the group III nitride semiconductor multilayer structure 2 are provided on regions avoiding the cavity region provided with the ridge stripe 20. More specifically, the removal regions 51 and 52 are formed on both side edges in the device width direction (direction parallel to the major growth surface of the group III nitride semiconductor multilayer structure 2) orthogonal to the cavity direction (longitudinal direction of the ridge stripe 20) over the total length of the device, i.e., over regions reaching the cavity end face 22 from the cavity end face 21. According to this embodiment, the removal regions 51 and 52 are rectangular regions having constant widths (50 μm, for example). However, the present invention is not restricted to this, but the widths $z_1$ and $z_2$ of the removal regions 51 and 52 may simply be not less than 10 μm, for example, respectively.

According to this embodiment, the removal regions 51 and 52 are formed by partially removing the group III nitride semiconductor multilayer structure 2 until the substrate 1 is exposed on both sides of the ridge stripe 20. In other words, the group III nitride semiconductor multilayer structure 2 is entirely removed from the removal regions 51 and 52, so that no group III nitride semiconductor layers containing Al such as the AlInGaN contact layer 13, the n-type AlGaN cladding layer 14, the p-type AlGaN electron blocking layer 16, the p-type AlGaN cladding layer 18 and the p-type AlInGaN contact layer 19 are present on these regions. More specifically, the substrate 1 is etched up to a prescribed depth according to this embodiment, to eliminate all the layers constituting the group III nitride semiconductor multilayer structure 2 from the removal regions 51 and 52.

While a warp can be effectively prevented as the widths $z_1$ and $z_2$ of the removal regions 51 and 52 are increased, the widths $z_1$ and $z_2$ of the removal regions 51 and 52 are preferably set in the range not damaging the ridge stripe 20 by the etching etc. for partially removing the group III nitride semiconductor multilayer structure 2. Assuming that y represents the width of the semiconductor multilayer structure 2 after the formation of the removal regions 51 and 52, for example, the width y may be at least twice to three times the width x (about 1 μm to 2 μm) of the ridge. If the width y is excessively small, however, a problem may be caused in strength, to result in cracking. Therefore, the width y is preferably set to not less than 50 μm.

The n-type electrode 3 and the p-type electrode 4, made of an Al metal, for example, are in ohmic contact with the p-type contact layer 19 and the group III nitride semiconductor substrate 1 respectively. Insulating layers 6 covering the exposed surfaces of the substrate 1, the n-type semiconductor layered portion 11, the light emitting layer 10 and the p-type semiconductor layered portion 12 are provided such that the p-type electrode 4 is in contact with only the p-type AlInGaN contact layer 19 provided on a top face of the ridge stripe 20. Thus, a current can be concentrated on the ridge stripe 20, thereby enabling efficient laser oscillation. In the semiconductor laser diode 70, a portion immediately under the ridge stripe 20 on which the current concentrates forms a light guide 25 for transmitting light. The width of the light guide 25 is 1 μm to 2 μm, for example.

Insulating films 23 and 24 (see FIG. 2) different in reflectivity from each other are formed on the cavity end faces 21 and 22 respectively. More specifically, the insulating film 23 having small reflectivity is formed on the emitting-side cavity end face 21, and the insulating film 24 having large reflectivity is formed on the opposite cavity end face 22. Therefore, the emitting-side cavity end face 21 emits a larger quantity of laser output.

According to this structure, light having the wavelength of 400 nm to 550 nm can be emitted by connecting the n-type electrode 3 and the p-type electrode 4 to a power source and injecting the electrons and the positive holes into the light emitting layer 10 from the n-type semiconductor layered portion 11 and the p-type semiconductor layered portion 12 respectively, thereby recombining the electrons and the positive holes in the light emitting layer 10. This light reciprocates between the cavity end faces 21 and 22 along the guide layers 15 and 17, and is amplified by induced emission. Thus, a larger quantity of laser output is extracted from the cavity end face 21 serving as the laser emitting end face.

A method of manufacturing the semiconductor laser diode 70 is now described.

Figure 4:
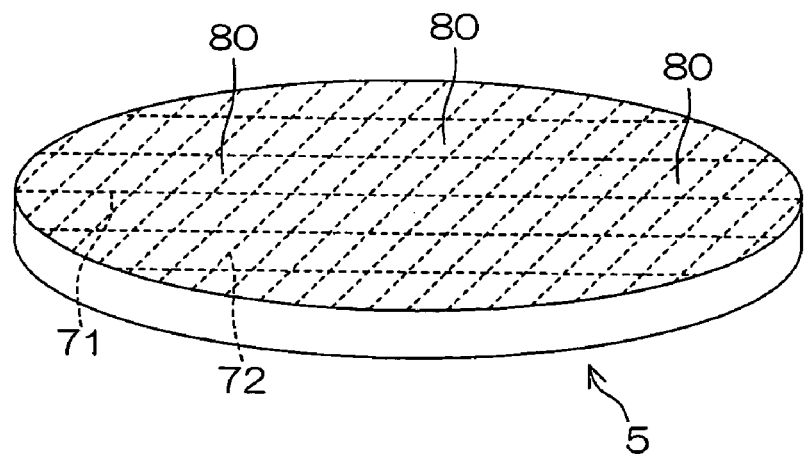
FIG. 4 is a perspective view schematically showing a wafer provided with individual devices.

In order to manufacture the semiconductor laser diode 70, individual devices 80 (group III nitride semiconductor substrates) each constituting the semiconductor laser diode 70 is formed on a wafer 5 constituting the aforementioned group III nitride semiconductor substrate 1 formed of a GaN monocrystalline substrate, as schematically shown in FIG. 4.

More specifically, the n-type semiconductor layered portion 11, the light emitting layer 10 and the p-type semiconductor layered portion 12 are epitaxially grown on the wafer 5 (in the state of the GaN monocrystalline substrate), thereby forming the group III nitride semiconductor multilayer structure 2. After the formation of the group III nitride semiconductor multilayer structure 2, the ridge stripe 20 is formed by dry etching, for example, and the removal regions 51 and 52 are further formed. Then, the insulating layers 6, the p-type electrode 4 and the n-type electrode 3 are formed. Thus, the wafer 5 is obtained in the state provided with each individual device 80. In advance of the formation of the n-type electrode 3, grinding/polishing (chemical mechanical polishing, for example) is performed from the back surface of the wafer 5 in order to reduce the thickness thereof, if necessary. The thickness of the wafer 5 is reduced such that the thickness from the substrate 1 to the group III nitride semiconductor multilayer structure 2 is not more than 80 μm, for example.

The respective individual devices 80 are formed on rectangular regions partitioned by tessellated cutting lines 71 and 72 (virtual lines) virtually formed on the wafer 5. When the major surface of the substrate 1 is defined by the c-plane, the cutting lines 71 and 72 are along m- and a-planes. When the major surface of the substrate 1 is defined by the m-plane, on the other hand, the cutting lines 71 and 72 are along c- and a-planes.

The wafer 5 is divided into the respective individual devices 80 along these cutting lines 71 and 72. In other words, the wafer 5 is cleaved along the cutting lines 71 and 72, to cut out the individual devices 80.

Figure 5A:
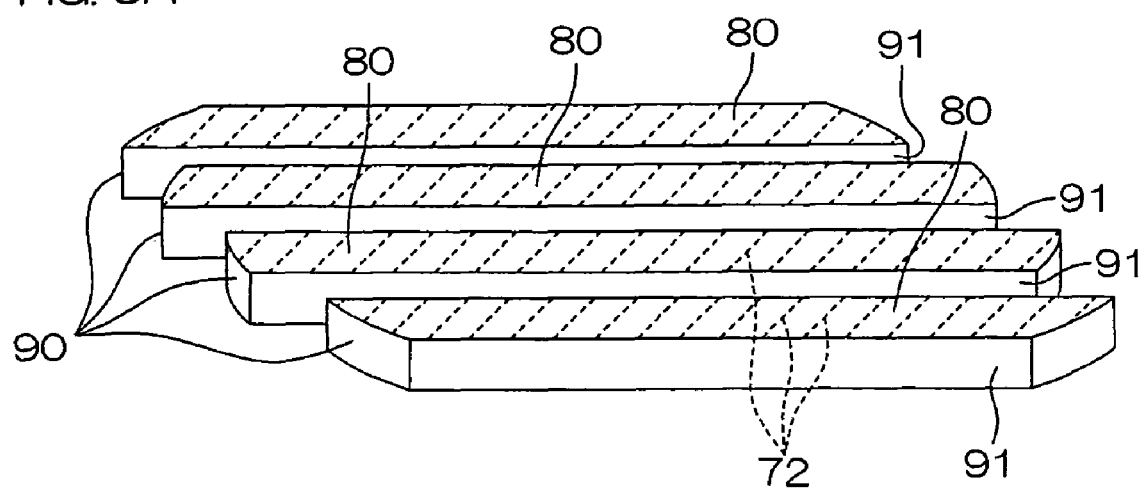
FIGS. 5A and 5B are schematic perspective views for schematically showing a procedure of dividing the wafer into the individual devices.
Figure 5B:
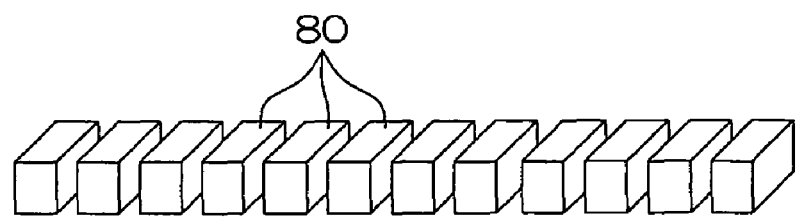

FIGS. 5A and 5B are schematic perspective views for illustrating an outline of the procedure for dividing the wafer 5 into the individual devices 80. First, the wafer 5 is cleaved along the cutting lines 71 orthogonal to the cavity direction. Thus, a plurality of bar bodies 90 are obtained, as shown in FIG. 5A. Both side surfaces 91 of each bar body 90 are defined by the crystal planes for forming the resonator end faces 21 and 22. The aforementioned insulating films 23 and 24 (see FIG. 2) are formed on the side surfaces 91 of each bar body 90.

Then, each bar body 90 is cut along the cutting lines 72 parallel to the cavity direction. Thus, the bar body 90 is divided into the individual devices 80 and a plurality of chips are obtained, as shown in FIG. 5B.

Figure 6:
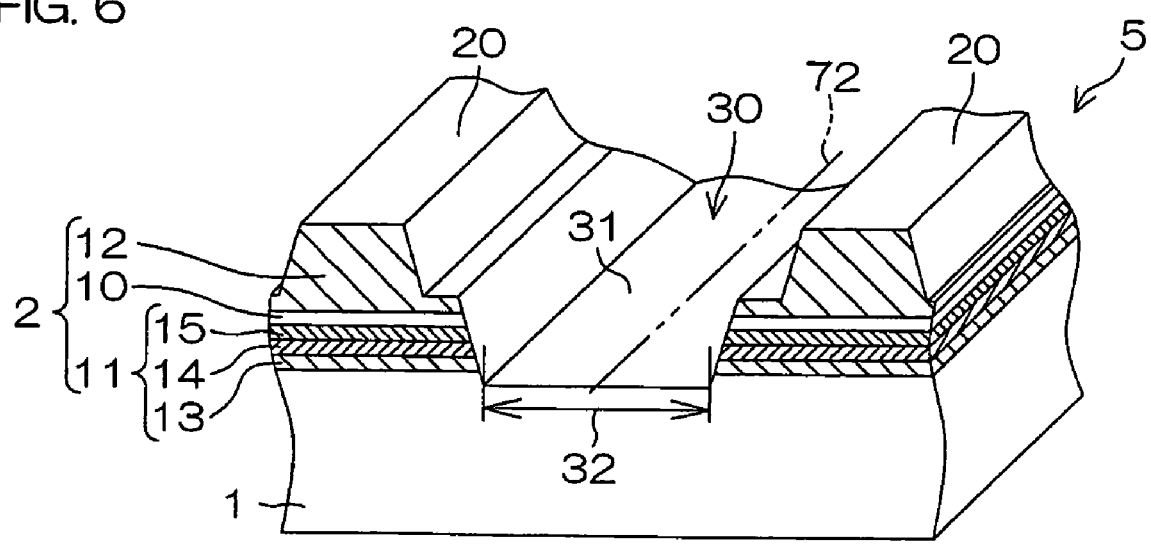
FIG. 6 is a schematic perspective view for illustrating a step of forming removal regions.
Figure 7:
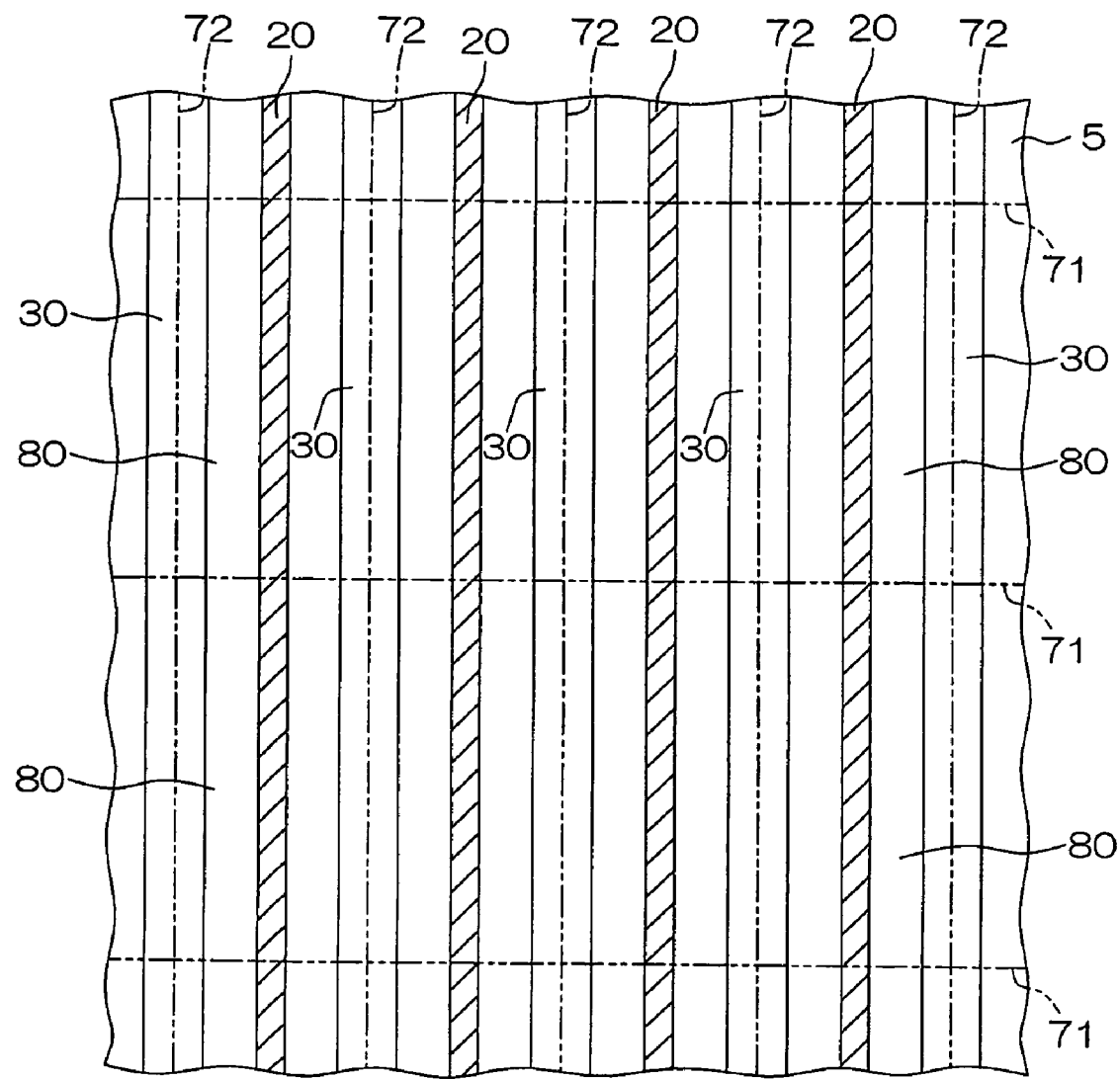
FIG. 7 is a schematic plan view for illustrating regions provided with etching grooves for the removal regions.

FIG. 6 is a schematic perspective view for illustrating the step of forming the removal regions 51 and 52. The group III nitride semiconductor multilayer structure 2 is selectively etched on a region of a prescribed width along each cutting line 72 parallel to the cavity direction. This etching is performed up to a depth for exposing the substrate 1 through the p-type semiconductor layered portion 12 and the light emitting layer 10 as well as the n-type semiconductor layered portion 11. In other words, an etching groove 30 having the depth for exposing the substrate 1 is formed along the cutting line 72. When the width of the semiconductor laser diode 70 is about 150 μm, for example, the width 32 of a bottom surface portion 31 (exposed portion of the substrate 1) of the etching groove 30 is set to about 100 μm (about twice the widths $z_1$ and $z_2$ of the removal regions 51 and 52). Such etching grooves 30 are formed along the cutting lines 72 parallel to the cavity direction, as shown in FIG. 7. FIG. 7 shows ridge stripes 20 with slanting lines.

Thereafter the wafer 5 is divided along the cutting lines 71 and 72, after the formation of the insulating layers 6 and the p-type electrode 4. Thus, the semiconductor laser diode 70 is obtained with the removal regions 51 and 52 provided on both side edges of each chip on both sides of the ridge stripe 20, as shown in FIG. 1 etc.

According to this embodiment, as hereinabove described, the removal regions 51 and 52 are formed on both side edges of the semiconductor laser diode 70 on both sides of the ridge stripe 20. The n-type semiconductor layered portion 11, the light emitting layer 10 and the p-type semiconductor layered, portion 12 are partially removed such that no layers containing Al are present on the removal regions 51 and 52. Thus, stress resulting from the layers containing Al, particularly the n-type AlGaN contact layer 13 and the n-type AlGaN cladding layer 14 can be relaxed. Consequently, a warp of the semiconductor laser diode 70 can be suppressed, whereby the yield can be improved.

Further, the semiconductor laser diode 70 can be prevented from a warp, so that the thickness thereof can be reduced. More specifically, the semiconductor laser diode 70 is not remarkably warped when the substrate 1 is ground from the back surface to reduce the thickness thereof. Also when the semiconductor laser diode 70 is small-sized, therefore, smooth cleavage planes can be obtained upon cleavage of the wafer 5, due to the reduction thickness of the wafer 5. Therefore, the cavity end faces 21 and 22 can be formed by the smooth cleavage planes. Thus, the semiconductor laser diode 70 can be implemented with excellent lasing efficiency. Further, the size of the semiconductor laser diode 70 can be reduced without sacrificing the yield, whereby the yield of devices obtainable from the wafer 5 can be increased, and the cost can be reduced as a result.

More specifically, the semiconductor laser diode 70 can be prevented from a remarkable warp even if the thickness of the wafer 5 is reduced to not more than 80 μm. Therefore, smooth cleavage planes can be obtained by cleaving the wafer 5 along the cutting lines 71 and 72, also in a case of manufacturing a small-sized device having a cavity length of not more than 300 μm and a width of not more than 150 μm, for example. Thus, the semiconductor laser diode 70 having excellent lasing efficiency can be obtained by forming smooth cavity end faces 21 and 22 while increasing the yield of the devices obtainable from the wafer 5.

Figure 8A:
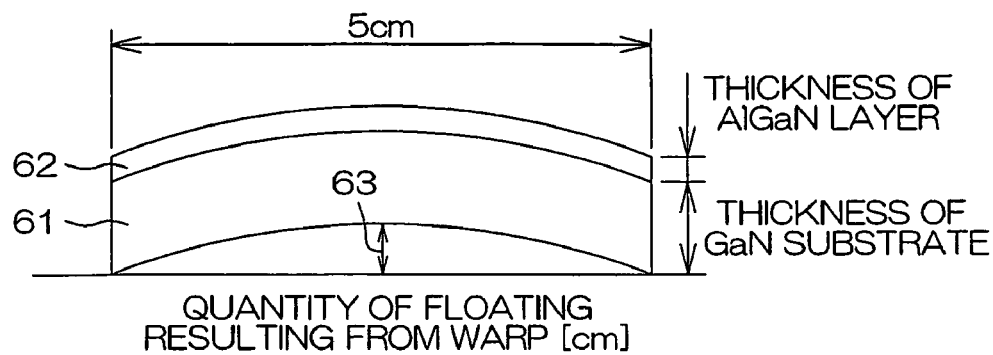
FIGS. 8A and 8B are diagrams for illustrating a problem of a warp of a wafer resulting from an AlGaN layer.
Figure 8B:
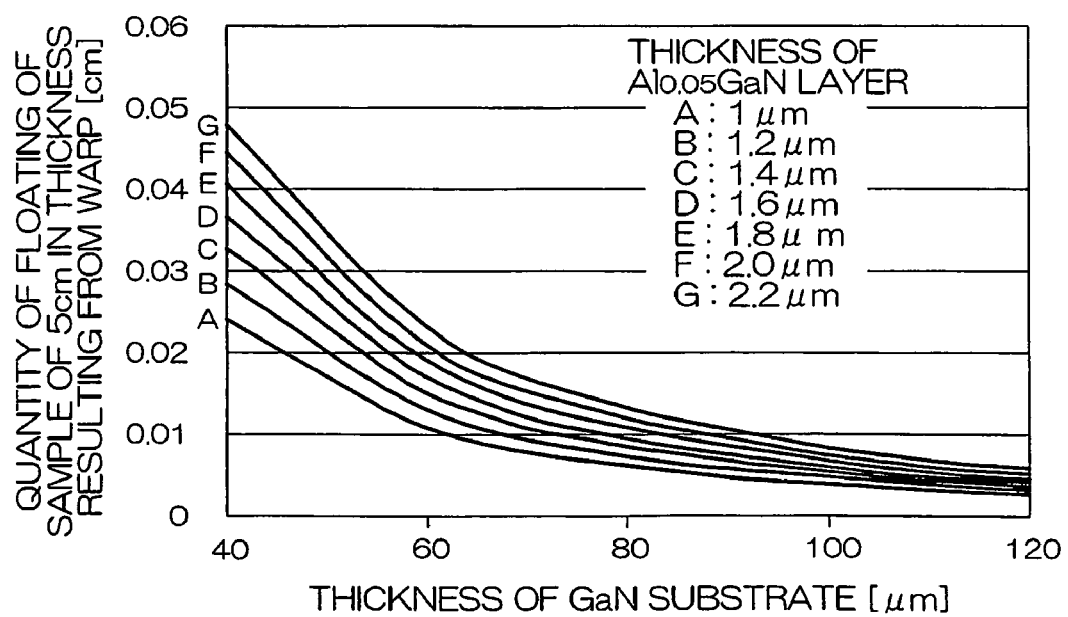

FIGS. 8A and 8B are diagrams for illustrating a problem, of a warp of a wafer resulting from an AlGaN layer. FIG. 8A shows a sample of 5 cm in length prepared by forming an AlGaN layer 62 (having an Al composition of 5%) on a GaN substrate 61, and FIG. 8B shows quantities 63 of floating of such samples resulting from warps. More specifically, FIG. 8B shows the quantities 63 of floating measured as to a plurality of samples including GaN substrates 61 and AlGaN layers 62 having different thicknesses.

It is understood from FIGS. 8A and 8B that the wafer is warped due to the presence of the AlGaN layer, and the warp is remarkably caused as the thickness of the GaN substrate is reduced. Particularly in the region where the thickness of the GaN substrate is not more than 80 μm, the quantity of floating exceeds 10 μm. When a substrate having a thickness in this region is employed, therefore, a remarkable effect of suppressing a warp can be attained by forming removal regions by partially removing layers containing Al according to the aforementioned embodiment.

While the embodiment of the present invention has been described, the present invention may be embodied in other ways. For example, while the cladding layers 14 and 18 are formed by single films of AlGaN in the aforementioned embodiment, either one or each of the cladding layers 14 and 18 may be comprised of an AlGaN/GaN superlattice structure film formed by alternately stacking AlGaN layers (each having a thickness of 5 nm, for example) and GaN layers (each having a thickness of 5 nm, for example) a plurality of times. According to this structure, stress resulting from the cladding layers 14 and 18 can be further relaxed, and the semiconductor laser diode 70 can be prevented from a warp in response thereto.

The n-type contact layer 13, comprised of AlGaN in the aforementioned embodiment, may alternatively be constituted of n-type GaN. In this case, the n-type contact layer 13 may be entirely or partially left on the substrate 1 in the removal regions 51 and 52.

The guide layers 15 and 17, constituted of GaN in the aforementioned embodiment, can alternatively be constituted of InGaN.

Further, the removal regions 51 and 52, formed over the total cavity length in the aforementioned embodiment, may not be continuous regions between the cavity end faces 21 and 22. In other words, removal regions shorter than the cavity length may be formed, or a plurality of separated removal regions may be arranged along the cavity direction. In addition, the removal regions 51 and 52 may not be formed on both sides of the cavity region (region of the ridge stripe 20), but a removal region may be formed only on one side of the cavity region.

The major surface of the group III nitride semiconductor substrate 1 may not necessarily be defined by the c-plane or them-plane, but a group III nitride semiconductor substrate having a major surface defined by an a-plane or another crystal plane may alternatively be employed.

While the group III nitride semiconductor multilayer structure 2 is formed on the group III nitride semiconductor substrate 1 consisting of the GaN monocrystalline substrate in the aforementioned embodiment, the present invention is also applicable to another group III nitride semiconductor substrate such as an InGaN substrate containing no Al, so that the thickness of the device can be reduced while preventing a warp thereof.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2007-340213 filed in the Japanese Patent Office on Dec. 28, 2007, the entire disclosure of which is incorporated herein by reference.

What is claimed is:

1. A nitride semiconductor laser device formed by growing a group III nitride semiconductor multilayer structure on a substrate containing no Al, wherein
the group III nitride semiconductor multilayer structure forms a structure including an n-type semiconductor layer, a p-type semiconductor layer, and a light emitting layer held between the n-type semiconductor layer and the p-type semiconductor layer,
the n-type semiconductor layer includes an n-type cladding layer containing Al and an n-type guide layer having a smaller band gap than the n-type cladding layer,
the p-type semiconductor layer includes a p-type cladding layer containing Al and a p-type guide layer having a smaller band gap than the p-type cladding layer, and
a removal region is formed by partially removing the layers containing Al in the group III nitride semiconductor multilayer structure from the substrate, wherein the group III nitride semiconductor multilayer structure is removed until the substrate is exposed in the removal region;
wherein the n-type semiconductor layer is formed by successively stacking: an n-type contact layer, an n-type cladding layer, and an n-type guide layer from a side closer to the substrate; and the p-type semiconductor layer is formed by successively stacking: a p-type guide layer, a p-type cladding layer, and a p-type contact layer from a side closer to the light emitting layer;
wherein the n-type contact layer and the p-type contact layer have a composition of Al—In—Ga—N, the n-type cladding layer and the p-type cladding layer have a composition of Al—Ga—N, and the n-type guide layer and the p-type guide layer have a composition of GaN.

2. The nitride semiconductor laser device according to claim 1, having a thickness of not more than 80 μm.

3. The nitride semiconductor laser device according to claim 1, having a cavity length of not more than 300 μm.

4. The nitride semiconductor laser device according to claim 1, having a width of not more than 150 μm.

5. The nitride semiconductor laser device according to claim 1, wherein
the removal region is a region continuous from one cavity end face to another cavity end face.

6. The nitride semiconductor laser device according to claim 1, wherein
the removal region is arranged to avoid a cavity region.

7. The nitride semiconductor laser device according to claim 1, wherein
the removal region is provided on a side edge in a width direction orthogonal to a cavity direction.

8. The nitride semiconductor laser device according to claim 1, wherein
the removal region is provided on each side edge in a width direction orthogonal to a cavity direction.

9. The nitride semiconductor laser device according to claim 1, wherein
the removal region is a region provided on a side edge in a width direction orthogonal to a cavity direction and continuous from one cavity end face to another cavity end face.

10. The nitride semiconductor laser device according to claim 1, wherein
the removal region is a region provided on each side edge in a width direction orthogonal to a cavity direction and continuous from one cavity end face to another cavity end face.

11. The nitride semiconductor laser device according to claim 1, wherein
the substrate is etched up to a prescribed depth in the removal region.

* * * * *